United States Patent
Murakami

(10) Patent No.: US 10,972,005 B2
(45) Date of Patent: Apr. 6, 2021

(54) CHARGE PUMP CIRCUIT, SEMICONDUCTOR DEVICE, AND SEMICONDUCTOR MEMORY DEVICE

(71) Applicant: Winbond Electronics Corp., Taichung (TW)

(72) Inventor: Hiroki Murakami, Taichung (TW)

(73) Assignee: Winbond Electronics Corp., Taichung (TW)

(*) Notice: Subject to any disclaimer, the term of this patent is extended or adjusted under 35 U.S.C. 154(b) by 0 days.

(21) Appl. No.: 16/743,324

(22) Filed: Jan. 15, 2020

(65) Prior Publication Data

US 2020/0244162 A1    Jul. 30, 2020

(30) Foreign Application Priority Data

Jan. 29, 2019 (JP) .............................. JP2019-012678

(51) Int. Cl.
G11C 5/14 (2006.01)
H02M 3/07 (2006.01)
G11C 16/30 (2006.01)

(52) U.S. Cl.
CPC .............. *H02M 3/073* (2013.01); *G11C 16/30* (2013.01)

(58) Field of Classification Search
CPC ......... G11C 16/30; G11C 5/145; G11C 16/12; G11C 16/14; G11C 16/28; H02M 3/073; H02M 3/07; H02M 2003/075; H02M 2003/077; H02M 1/36; H02M 2001/0058; H02M 1/44; H02M 2001/007; H02M 2003/071; H02M 2003/076; H02M 2003/1557; H02M 3/156; H02M 3/158; H02M 1/14; H02M 1/32

USPC .............. 365/226, 185.27, 189.09, 227, 177, 365/185.05, 185.18, 185.23, 204
See application file for complete search history.

(56) References Cited

U.S. PATENT DOCUMENTS

| 2005/0213781 A1* | 9/2005 | Suzuki .................. H02M 3/073 381/104 |
| 2014/0225652 A1 | 8/2014 | Wang et al. |
| 2017/0316834 A1 | 11/2017 | Huynh et al. |

FOREIGN PATENT DOCUMENTS

| CN | 1245595 A | 2/2000 |
| CN | 1674444 A | 9/2005 |
| CN | 102347687 A | 2/2012 |
| JP | H097384 A | 1/1997 |
| JP | 2005235315 A | 9/2005 |

(Continued)

OTHER PUBLICATIONS

KIPO Notice to Submit Response dated Feb. 9, 2021 in corresponding KR Application 10 2019 0172507, with English translation, 10 pages.

*Primary Examiner* — Thong Q Le
(74) *Attorney, Agent, or Firm* — Muncy, Geissler, Olds & Lowe, P.C.

(57) ABSTRACT

A charge pump circuit that suppresses low boost efficiency is provided. The charge pump circuit 100 of the invention includes a main pump circuit CPn_M and a gate controlling pump circuit CPn_G controlling the main pump circuit CPn_M. The main pump circuit has the same basic configuration as the controlling pump circuit, which are both KER-type pump circuits. The controlling pump circuit controls the operation of a transistor of the main pump circuit after the main pump circuit is boosted, so that reverse current will not flow from the main pump circuit to the forward section of the pump circuit.

10 Claims, 5 Drawing Sheets

(56) References Cited

FOREIGN PATENT DOCUMENTS

| | | |
|---|---|---|
| JP | 2008-211957 A | 9/2008 |
| JP | 2009-225637 A | 10/2009 |
| JP | 2012210026 A | 10/2012 |
| TW | 201337499 | 9/2013 |
| TW | 201521341 A | 6/2015 |

* cited by examiner

CHARGE PUMP CIRCUIT, SEMICONDUCTOR DEVICE, AND SEMICONDUCTOR MEMORY DEVICE

CROSS REFERENCE TO RELATED APPLICATIONS

The present application is based on, and claims priority from, Japan Application Serial Number 2019-012678, filed on Jan. 29, 2019, the disclosure of which is hereby incorporated by reference herein in its entirety.

BACKGROUND

Field of the Invention

The present invention relates to a charge pump circuit (boost circuit), and more particularly, to a KER-type charge pump circuit.

Description of the Related Art

Along with the miniaturization of the semiconductor design, the operating voltage needed to for drive semiconductor elements has decreased, as has the supply voltage applied to semiconductor devices. For example, the supply voltage provided externally from the semiconductor memory has decreased from 3.3V to 2.5V or 1.8V. On the other hand, multiple supply voltages are required in internal circuits such as the internal circuit of the semiconductor memory. Sometimes the voltage needed for driving the transistor, or the voltage applied to the substrate or the well, may need to be higher than the supply voltage. Therefore, the semiconductor must comprise a boost circuit, which boosts the externally provided supply voltage to the expected voltage. Such a boost circuit is typically configured with a charge pump circuit.

For example, Japan Patent Publication Serial Number 2005-235315 discloses a boost circuit, which is a pump circuit comprising an inverter, a capacitor, and a switch connected in series. It can boost the supply voltage to more than double. The boost circuit serves as the internal circuit of the dynamic memory, and applies a high voltage Vpp that is higher than the supply voltage VDD to the word line.

FIG. 1 shows the configuration of a conventional KER-type charge pump circuit. The charge pump circuit comprises a plurality of sections (the first section to the n-th section, corresponding to the pump circuits CP1, CP2, ..., CPn-1, and CPn). The first section CP1 is connected to the input terminal VIN, and the voltage to be boosted is input via the input terminal VIN. The last section CPn is connected to the output terminal VOUT, and the boosted voltage is output via the output terminal VOUT. Each of the sections of the pump circuit has the same configuration. The last section can be referred to for a detailed description of the configuration.

The pump circuit comprises an NMOS transistor NA and a PMOS transistor PA, connected in series via a first node UA; a capacitor CA, connected to the first node UA; an NMOS transistor NB and a PMOS transistor PB, connected in series via a second node LA; and a capacitor CB, connected to the second node LA.

The two gates of the NMOS transistor NA and the PMOS transistor PA are coupled to the second node LA; the two gates of the NMOS transistor NB and the PMOS transistor PB are coupled to the first node UA. A clock signal CLKA is provided to the capacitor CA and a clock signal CLKB, obtained by inverting phase of the clock signal CLKA by 180 degrees, is provided to the capacitor CB. The sources of the NMOS transistors NA and NB are respectively connected to the PMOS transistors PAn-1 and PBn-1 of the pump circuit CPn-1 of a previous section to the last section; the sources of the PMOS transistors PA and PB are connected to the output terminal VOUT. In addition, the phases between the clocks CLKA and CLKB provided to the pump circuit of every section have been adjusted, such that the boosted voltage from the forward stage can be output to the backward stage appropriately.

FIG. 2 shows an operation waveform of the charge pump circuit as shown in FIG. 1. At time t1~t2, the clock CLKA rises from L level to H level, the voltage at the first node UA which is capacitively coupled to the clock CLKA via the capacitor CA is boosted, the NMOS transistor NB which is connected to the first node UA becomes conductive, the voltage boosted by the forward section of the pump circuit CPn-1, is provided to the second node LA via the NMOS transistor NB; on the other hand, the PMOS transistor PB becomes non-conductive, the second node LA is electrically isolated from the output terminal VOUT.

In addition, the clock CLKB falls from H level to L level, the voltage at the second node LA which is capacitively coupled to the clock CLKB via the capacitor CB is pulled to the negative direction, the NMOS transistor NA which is connected to the second node LA becomes non-conductive, the first node UA is electrically isolated from the forward section of the pump circuit; on the other hand, the PMOS transistor PA becomes conductive, the voltage boosted at the first node UA, is provided to the output terminal VOUT via the PMOS transistor PA.

At time t2~t3, the clock CLKA falls from H level to L level, the voltage at the first node UA is pulled to the negative direction, the NMOS transistor NB which is connected to the second node LA becomes non-conductive, the second node LA is electrically isolated from the forward section of the pump circuit CPn-1; on the other hand, the PMOS transistor PB becomes conductive, as further detailed, the voltage boosted at the second node LA is provided to the output terminal VOUT.

In addition, the clock CLKB rises from L level to H level, the voltage at the second node LA which is capacitively coupled to the clock CLKB is boosted, the NMOS transistor NA which is connected to the second node LA becomes conductive, the voltage boosted by the forward section of the pump circuit CPn-1 is provided to the first node UA; on the other hand, the PMOS transistor PB becomes non-conductive, the first node UA is electrically isolated from the output terminal VOUT.

In this way, the voltage boosted by the forward section of the pump circuit, is provided to the first node UA and the second node LA in synchronization with the clocks CLKA and CLKb alternately, the provided voltage is boosted in synchronization with the clocks CLKA and CLKb, the boosted voltage is output via the output terminal VOUT in synchronization with the clocks CLKA and CLKb alternately.

In particular, during the transition period of the clocks CLKA and CLKB from time t1 to t1A, although the voltage at the second node LA is pulled to the negative direction due to the clock CLKB, the NMOS transistor NB is conductive, the voltage boosted by the forward section of the pump circuit CPn-1 is provided to the second node LA, so the voltage of the second node LA does not actually decrease.

On the other hand, the clock CLKA makes the voltage at the first node UA boost to the positive direction, and the voltage of the first node UA becomes higher than the voltage of the forward section of the pump circuit (i.e., the voltage of the gate of the NMOS transistor NA). At this time, although the voltage at the second node LA connected to the gate of the NMOS transistor NA is pulled to the negative direction, the voltage of the second node LA is higher than the threshold value of the NMOS transistor NA, that is, in the period before the NMOS transistor NA is completely cut-off, the unexpected reverse current i(NA), will flow from the first node UA to the forward section of the pump circuit CPn-1 via the NMOS transistor NA. Even in the transition period t2~t2A, the unexpected reverse current i(NB) will also flow from the boosted second node LA to the forward section of the pump circuit CPn-1 via the NMOS transistor NB. This situation will also happen during the other periods t3~t3A and t4~t4A.

Since such a reverse current will lower the boost efficiency, so it is better to suppress it as much as possible.

BRIEF SUMMARY

The object of the invention is to solve such a conventional problem, and is to provide a charge pump circuit that suppresses low boost efficiency.

A charge pump circuit according to the invention comprising: a main pump circuit having a first node, capacitively coupled to a first capacitor, and a first transistor connected to the first node and applying voltage to the first node; the main pump circuit boosting the voltage at the first node after the first clock signal is applied to the first capacitor; and a controlling pump circuit, connected to the main pump circuit; wherein the controlling pump circuit controls the operation of the first transistor after the voltage at the first node is boosted, so that the reverse current will not flow from the first node to the first transistor.

According to the invention, since the current will not flow in the reverse direction from the boosted node of the main pump circuit by the controlling pump circuit, so it can suppress low boost efficiency. In addition, the basic configuration of the controlling pump circuit is the same as that of the main pump circuit, whereby the configuration of the charge pump circuit is simplified.

DETAILED DESCRIPTION

Next, embodiments of the invention will be described in detail with reference to the drawings. In the embodiments of the invention, are configured by using a so-called KER-type charge pump circuit.

Figure 3:
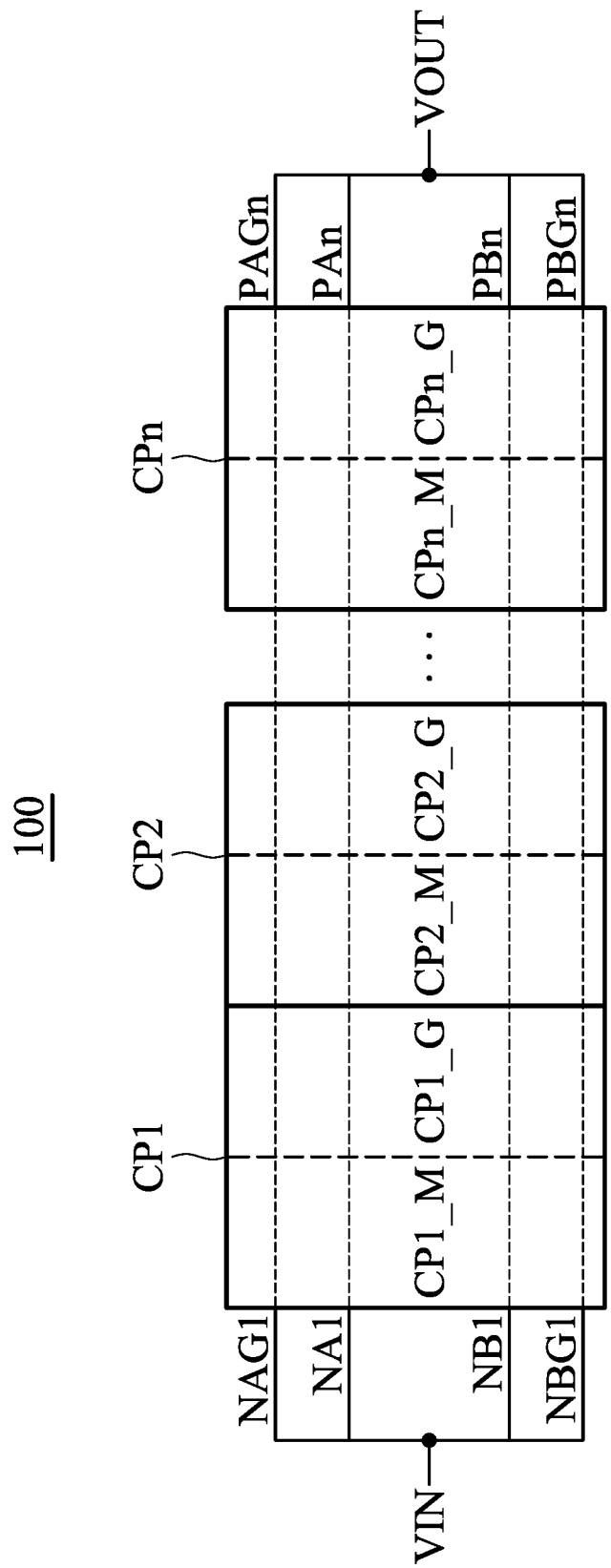
FIG. 3 shows a whole configuration of the charge pump circuit according to the invention.

FIG. 3 shows a whole configuration of the charge pump circuit (boost circuit) according to the invention. The charge pump circuit 100 according to the invention, is configured by connecting one or any section number of the pump circuit(s), in this figure, the charge pump circuit 100 comprises n sections of pump circuits CP1, CP2 CPn. The first section CP1 is connected to the input terminal VIN, the input terminal VIN is used for inputting the voltage to be boosted; the last section CPn is connected to the output terminal VOUT, the output terminal VOUT is used for outputting the boosted voltage.

Each of the pump circuits CP1, CP2 CPn in each section comprises: a plurality of main pump circuits CP1_M, CP2_M, CPn_M for boosting voltage; and a plurality of gate controlling pump circuits CP1_G, CP2_G, CPn_G for controlling the gates of the transistors of the main pump circuits. The basic configuration of the main pump circuit and the gate controlling pump circuit are KER-type, the basic configuration of the main pump circuit and the gate controlling pump circuit in every section are essentially the same.

Figure 4:
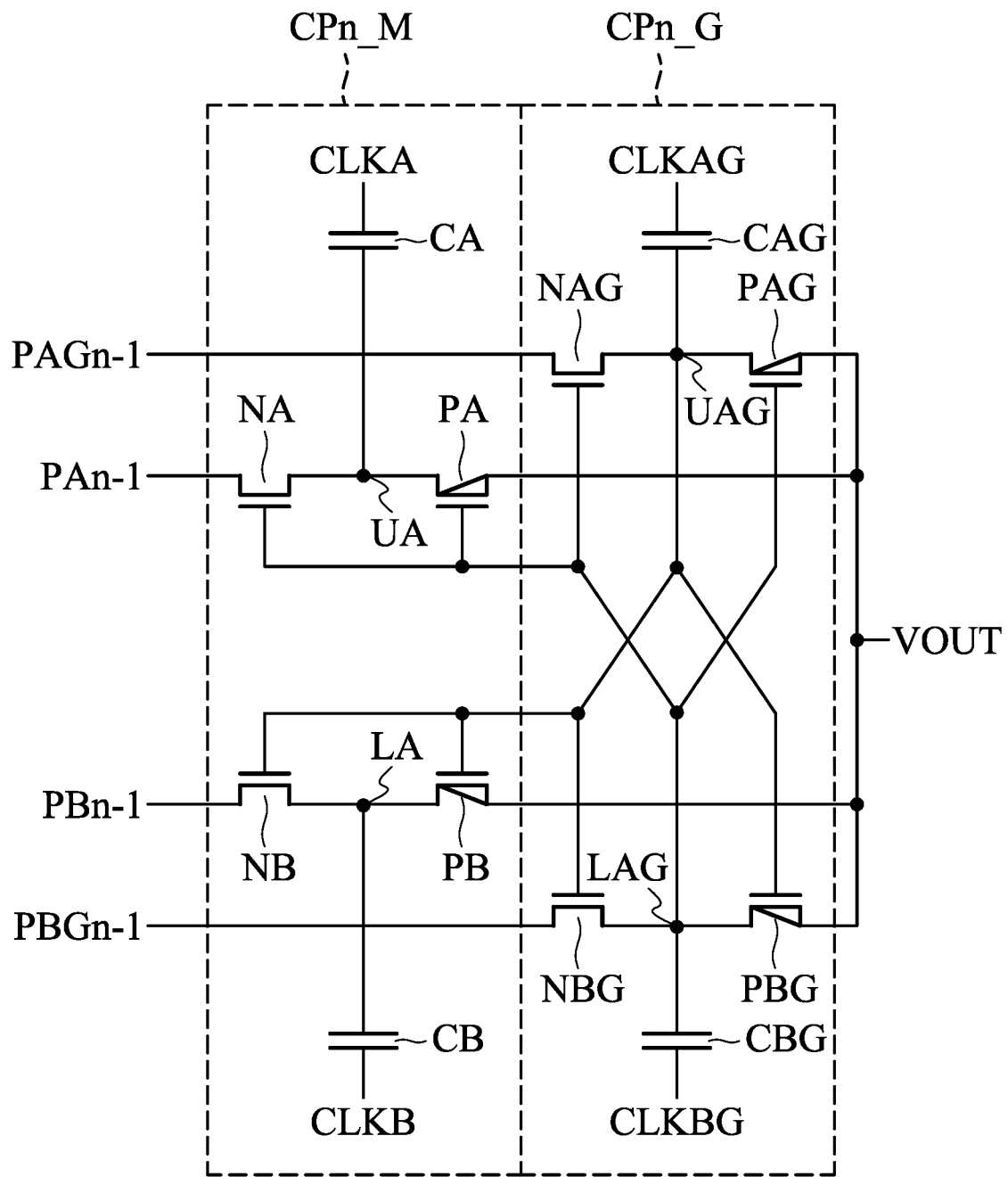
FIG. 4 shows a circuit diagram illustrating the configuration of the last section of the charge pump circuit according to the invention.

FIG. 4 shows the first section CPn of the charge pump circuit 100 shown in FIG. 3. As described above, the pump circuit CPn comprises: a main pump circuit CPn_M; and a gate controlling pump circuit CPn_G for controlling the gates of a pair of CMOS transistors of the main pump circuit CPn_M.

Figure 1:
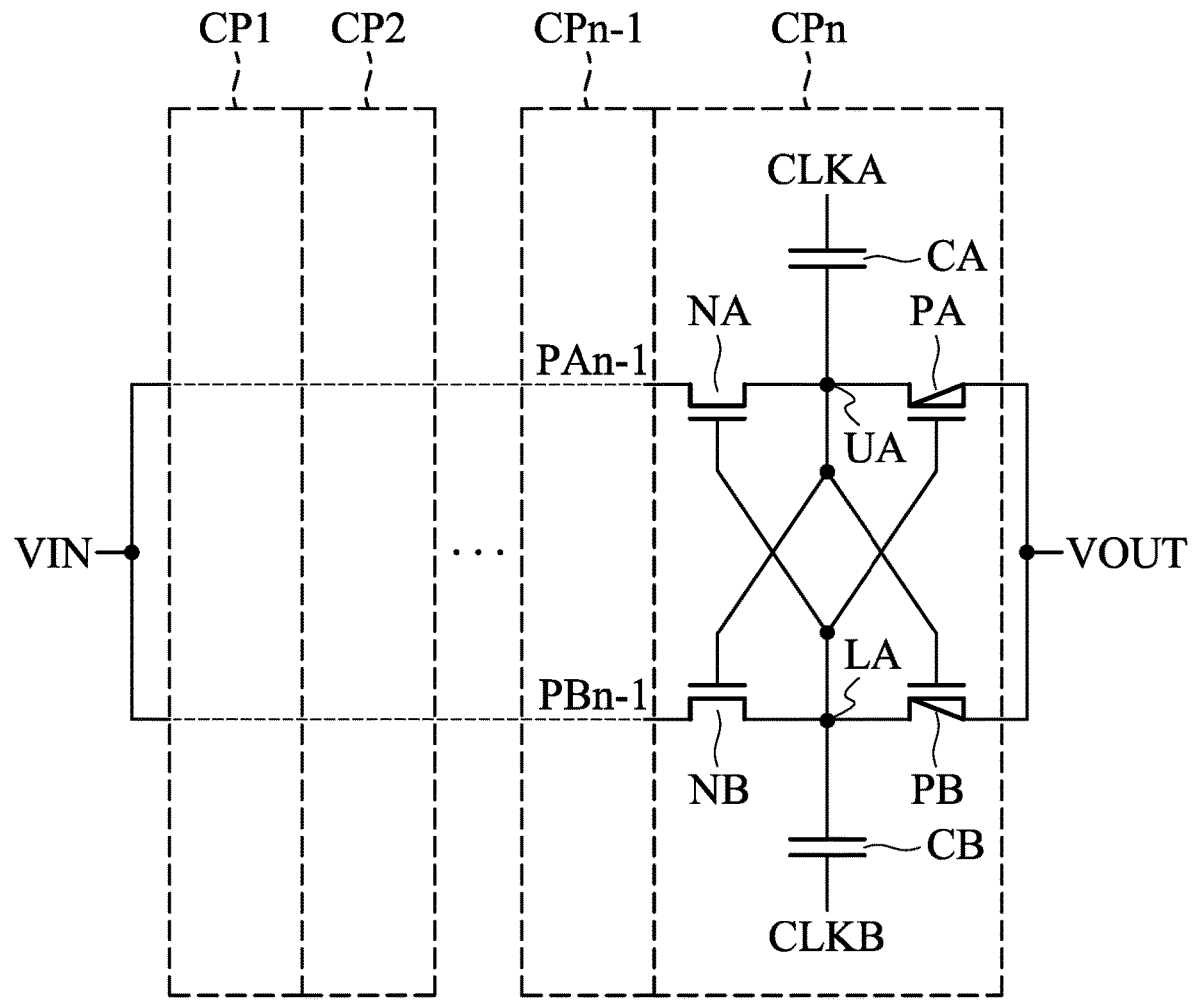
FIG. 1 shows a conventional charge pump circuit.
Figure 2:
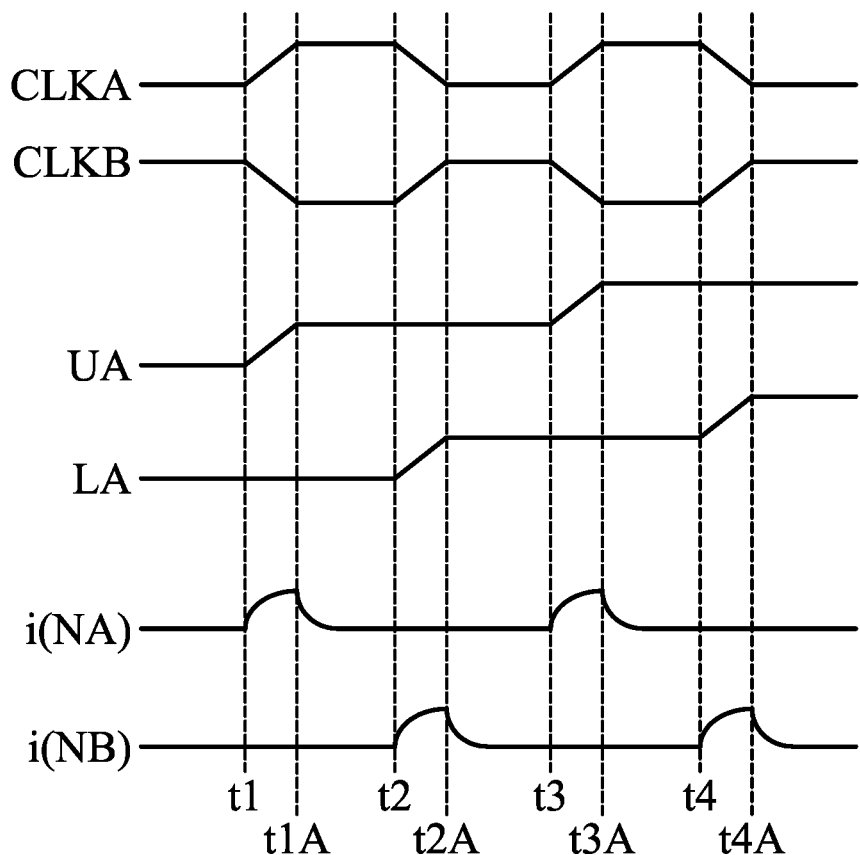
FIG. 2 shows a waveform in every parts of the conventional charge pump circuit.

The main pump circuit CPn_M has similar configuration to the KER-type pump circuit shown in FIG. 1, the main difference is that: the gates of the NMOS transistor NA and the PMOS transistor PA are connected to the second node LAG of the gate controlling pump circuit CPn_G; and the gates of the NMOS transistor NB and the PMOS transistor PB are connected to the first node UAG of the gate controlling pump circuit CPn_G. the sources of the NMOS transistor NA of the main pump circuit CPn_M, is connected in series to the PMOS transistor PAn-1 of the previous section CPn-1_M; the sources of the NMOS transistor NB, is connected in series to the PMOS transistor PBn-1 of the forward section of the main pump circuit CPn-1_M; and the sourced of the PMOS transistor PA and PB, are connected to the output terminal VOUT.

The gate controlling pump circuit CPn_G has similar configuration to the KER-type pump circuit shown in FIG. 1; the first node UAG not only connected to the gates of the NMOS transistor NBG and the PMOS transistor PBG, but also connected to the gates of the NMOS transistor NB and the PMOS transistor PB of the main pump circuit CPn_M; and the second node LAG not only connected to the gates of the NMOS transistor NAG and the PMOS transistor PAG, but also connected to the gates of the NMOS transistor NA and the PMOS transistor PA of the main pump circuit CPn_M. In addition, the source of the NMOS transistor NAG, is connected in series to the PMOS transistor PAGn-1 of the forward section of the gate controlling pump circuit CPn-1_G; the source of the NMOS transistor NBG, is connected in series to the PMOS transistor PBGn-1 of the forward section of the gate controlling pump circuit CPn-1_G; and the sources of the PMOS transistors PAG and PBG, are connected to the output terminal VOUT.

Figure 5:
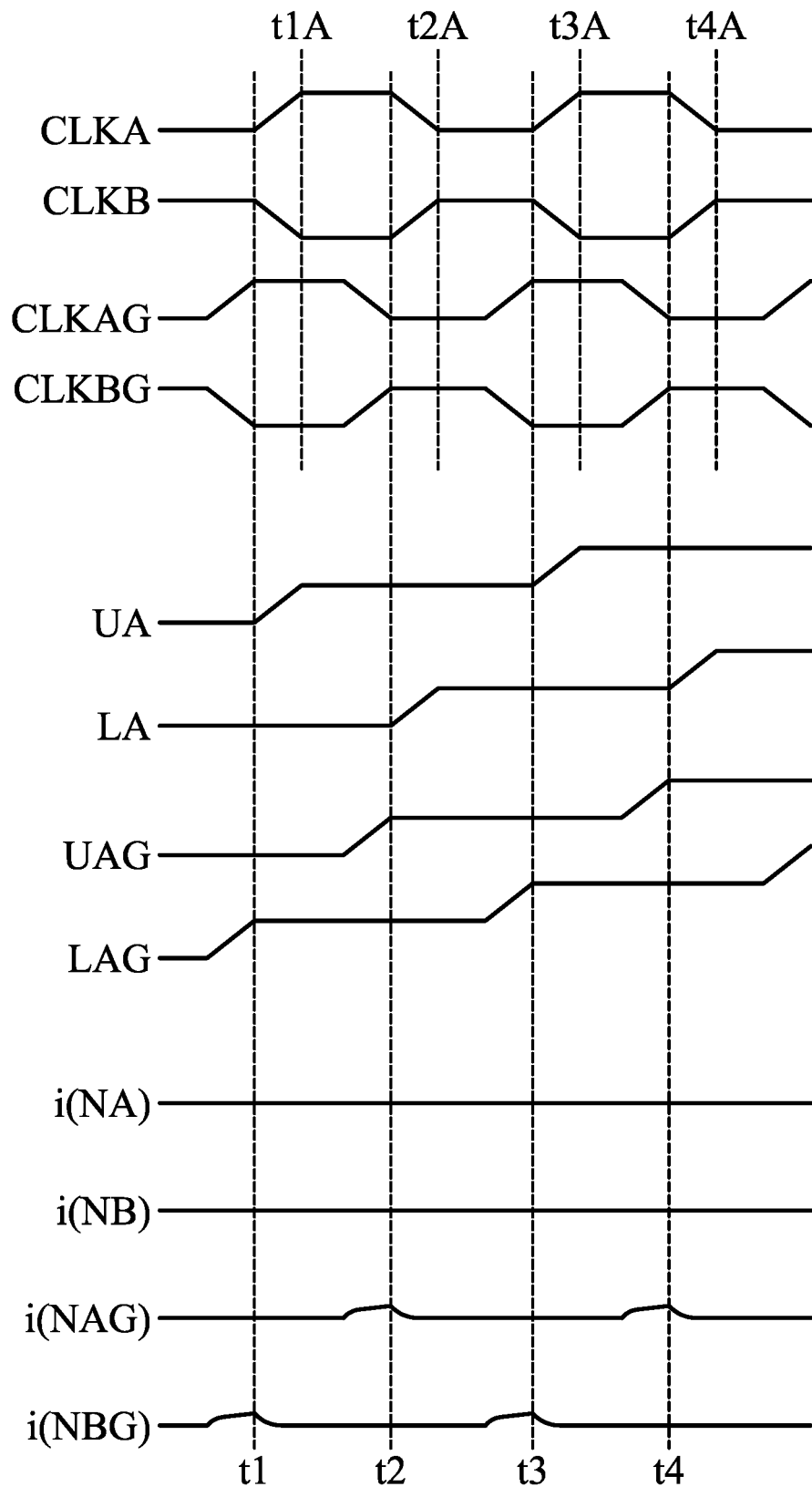
FIG. 5 shows a waveform in every parts of the last section of the charge pump circuit according to the invention.

The capacitor CAG is connected to the first node UAG, the clock CLKAG is provided to the capacitor CAG. The capacitor CBG is connected to the second node LAG, the clock CLKBG, obtained by inverting phase of the clock CLKAG by 180 degrees, is provided to the capacitor CBG. It should be noted that the capacitance of capacitors CAG and CBG are lower than the capacitance of capacitors CA and CB of the main pump circuit CPn_M. It should also be noted that although the clock frequency of clocks CLKAG and CLKBG are the same as those of clocks CLKA and CLKB, the phases of two clocks do not overlap during the rising and falling transition. In other words, during the rising and falling transition period of clocks CLKA and CLKB, clocks CLKAG and CLKBG are completely at L level or H level. For example, as shown in FIG. 5, at the time when clock CLKA rises, clock CLKBG is completely at L level; and at the time when clock CLKB rises, clock CLKAG is completely at L level.

Next, the operation of the charge pump circuit according to the embodiment will be described in detail with reference to the timing chart shown in FIG. 5. The clock CLKA/CLKB/CLKAG/CLKBG of which the phase is adjusted, is provided to each section of the pump circuits, such that the boosted voltage at the forward section of the pump circuit is provided to the next pump circuit. In the main pump circuit, at time t1~t1A, the clock CLKA shifts from L level to H level, the voltage at the first node UA is boosted. At this time, because the clock CLKBG is completely L level, the second node LAG is also L level, the NMOS transistor NA is non-conductive. Therefore, during the transition period t1~t1A, although the voltage at the first node UA becomes higher than the source of the NMOS transistor NA, it is possible to avoid the reverse current to flow from the first node UA to the forward section of the pump circuit via the NMOS transistor NA.

In addition, at time t2~t2A, the clock CLKB shifts from L level to H level, the second node LA is boosted. At this time, the gate of the NMOS transistor NB, is controlled by the first node UAG of the gate controlling pump circuit CPn_G. In other words, because the clock CLKAG is completely L level, the first node UAG is also L level, the NMOS transistor NB is non-conductive. Therefore, during the transition period t1~t1A of the clock CLKB, although the voltage at the second node LA becomes higher than the source of the NMOS transistor NB, it is possible to avoid the reverse current to flow from the second node LA to the forward section of the pump circuit via the NMOS transistor NB.

After that, the boosted voltages at the first node UA and the second node LA, are also synchronized with the clocks CLKA and CLKB, and are provided to the output terminal VOUT via the PMOS transistors PA and PB.

On the other hand, in the gate controlling pump circuit, during the transition period t1~t1A, although the reverse current will flow from the boosted first node UAG to the forward section of the pump circuit via the NMOS transistor NAG, the capacitance of the capacitor CAG is very small, the boosted voltage at the first node UAG is also very small, therefore, the reverse current which flows from the first node UAG to the forward section of the pump circuit via the NMOS transistor NAG is rare. In addition, during the transition period t2~t2A, although the reverse current will also flow from the second node LAG to the forward section of the pump circuit via the NMOS transistor NBG, that current is also rare.

According to the embodiment, the controlling pump circuit controls the operation of the main pump circuit while the main pump circuit is boosting so the reverse current will not flow from the main pump circuit to the forward section of the pump circuit. Therefore, the low efficiency of the pump circuit can be suppressed. In addition, since the controlling pump circuit with the same configuration controls the operation of the main pump circuit, the configuration of the pump circuit is simplified. In addition, by coupling the output of both the main pump circuit and the gate controlling pump circuit to the output terminal VOUT so that the operating condition of the transistors of the main pump circuit is the same as the operating condition of the transistors of the gate controlling pump circuit, it is therefore possible to stabilize the operation of the pump circuit. In addition, since the gate controlling pump circuit controls the operation of the main pump circuit, the size of capacitors CAG and CBG can be reduced as much as possible. It is therefore possible to suppress the useless current in the reverse direction as much as possible, and the overall size of the charge pump circuit can be minimized.

According to the embodiment, the charge pump circuit can be used in a semiconductor device that uses a high operating voltage or multiple supply voltages, or in a semiconductor memory device such as flash memory that requires high voltage for programming or erasing.

The preferable embodiments of this invention are described in detail; however, this invention is not limited to the specific embodiments, and various modifications or changes can be made within the scope of the object of the invention written in the claims.

What is claimed is:

1. A charge pump circuit comprising:
   a main pump circuit having a first node capacitively coupled to a first capacitor, and a first transistor connected to the first node and applying voltage to the first node; the main pump circuit boosting a voltage at the first node after a first clock signal is applied to the first capacitor; and
   a controlling pump circuit, connected to the main pump circuit;
   wherein the controlling pump circuit controls the operation of the first transistor after the voltage at the first node is boosted, so that a reverse current will not flow from the first node to the first transistor;
   wherein the controlling pump circuit comprises: a second node capacitively coupled to a second capacitor, and a second transistor connected to the second node and applying voltage to the second node; the controlling pump circuit boosting the second node after a second clock signal is applied to the second capacitor;
   wherein the second node is connected to a gate of the first transistor; the transition period in which the first clock signal rises and falls, does not overlap with the transition period in which the second clock signal rises and falls; so that when the voltage at the first node is boosted, the voltage at the second node is remained; and when the voltage at the second node is boosted, the voltage at the first node is remained.

2. The charge pump circuit according to claim 1, wherein the capacitance of the second capacitor is lower than the capacitance of the first capacitor.

3. The charge pump circuit according to claim 2, wherein the main pump circuit further comprises: a third node capacitively coupled to a third capacitor, and a third transistor connected to the third node and applying voltage to the third node; the main pump circuit boosting a voltage at the third node after a third clock signal is applied to the third capacitor;
   wherein the controlling pump circuit comprises: a fourth node capacitively coupled to a fourth capacitor, and a fourth transistor connected to the fourth node and applying voltage to the fourth node; the controlling pump circuit boosting the fourth node after a fourth clock signal is applied to the fourth capacitor;
   wherein the fourth node is connected to a gate of the third transistor; the capacitance of the fourth capacitor is lower than the capacitance of the third capacitor; the third clock signal is obtained by inverting the first clock signal; and the fourth clock signal is obtained by inverting the second clock signal.

4. The charge pump circuit according to claim 3,
wherein the main pump circuit comprises: a fifth transistor arranged between the first node and an output terminal wherein the conductivity type is different from that of the first transistor; and a sixth transistor arranged between the third node and the output terminal wherein the conductivity type is different from that of the third transistor; wherein the gates of the first transistor and the fifth transistor are connected to the second node of the controlling pump circuit; and the gates of the third transistor and the sixth transistor are connected to the fourth node of the controlling pump circuit.

5. The charge pump circuit according to claim 4,
wherein the controlling pump circuit comprises: a seventh transistor arranged between the second node and the output terminal wherein the conductivity type is different from that of the second transistor; and an eighth transistor arranged between the fourth node and the output terminal, wherein the conductivity type is different from that the fourth transistor; wherein the gates of the second transistor and the seventh transistor are connected to the fourth node; and the gates of the fourth transistor and the eighth transistor are connected to the second node.

6. The charge pump circuit according to claim 5,
wherein the first to fourth transistors are NMOS transistors and the fifth to eighth transistors are PMOS transistors.

7. The charge pump circuit according to claim 6,
wherein the charge pump circuit comprises a plurality of sections of main pump circuits and a plurality of sections of controlling pump circuits;
wherein the first transistor is connected in series to a fifth transistor of a forward section of the main pump circuit; and the third transistor is connected in series to a sixth transistor of the forward section of the main pump circuit;
wherein the second transistor is connected in series to a seventh transistor of a forward section of the controlling pump circuit; and the fourth transistor is connected in series to an eighth transistor of the forward section of the controlling pump circuit.

8. The charge pump circuit according to claim 1,
wherein the main pump circuit and the controlling pump circuit are KER-type pump circuits.

9. A semiconductor device comprising:
the charge pump circuit according to claim 1.

10. A semiconductor memory device comprising:
the charge pump circuit according to claim 1.

* * * * *